Sept. 11, 1962 J. J. TIEMANN 3,054,071

POLARITY-SENSITIVE NEGATIVE RESISTANCE OSCILLATOR WITH FREQUENCY SHIFT

Filed May 31, 1961

Inventor:
Jerome J. Tiemann,
by Joseph V. Claeys
His Attorney.

United States Patent Office 3,054,071

Patented Sept. 11, 1962

3,054,071
POLARITY-SENSITIVE NEGATIVE RESISTANCE OSCILLATOR WITH FREQUENCY SHIFT

Jerome J. Tiemann, Burnt Hills, N.Y., assignor to General Electric Company, a corporation of New York Filed May 31, 1961, Ser. No. 113,855
7 Claims. (Cl. 331—107)

This invention relates to oscillator circuits and in particular to a polarity-sensitive oscillator circuit utilizing semiconductor devices. As used throughout the specification and in the appended claims the term "polarity-sensitive" is intended to designate that the frequency of the oscillations produced is determined by the polarity of an applied input signal.

It is a primary object of this invention to provide a simple and inexpensive oscillator circuit adapted to produce oscillations at one frequency in response to an input signal of one-polarity and at a different frequency in response to an input signal of opposite polarity.

It is another object of this invention to provide such a polarity-sensitive oscillator circuit which operates with low power requirements.

It is still another object of this invention to provide a simple and inexpensive polarity-sensitive oscillator circuit which is capable of producing different frequency oscillations related to the polarity of, and from the power in, an applied input signal.

Briefly stated, in accordance with one aspect of this invention the polarity-sensitive oscillator circuit comprises a pair of semiconductor diode devices connected in back-to-back relationship each of which device exhibits a negative resistance region in a bias condition of one polarity and a low positive resistance in the corresponding opposite polarity bias condition thereof. The oscillator circuit includes means for developing a voltage from an applied signal providing one polarity bias condition for one semiconductor device, to establish operation therefor in its negative resistance region, and a corresponding opposite polarity bias condition for the other semiconductor device. The oscillator circuit further includes a frequency determining circuit having two different resonant circuit branches with each branch being effectively connected across one of the semiconductor devices to cause oscillations to be produced by the forwardly biased device. These oscillations are determined by the resonant impedance of the circuit branch connected across the forwardly biased semiconductor device.

The circuit of this invention, therefore, produces oscillations at a first frequency in response to the input signal of one polarity and oscillations at a second frequency in response to an input signal of opposite polarity.

Figure 1:
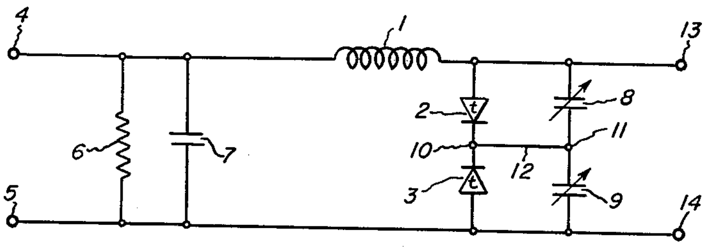
Figure 2:
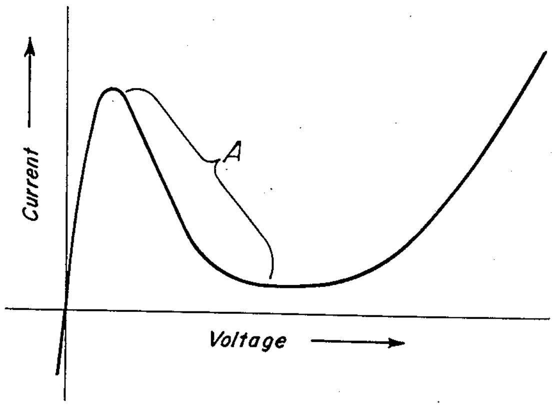

The novel features that are considered characteristic of my invention are set forth with particularity in the appended claims. My invention itself, however, both as to its organization and method of operation, together with further objects and advantages thereof may best be understood by reference to the following description taken in conjunction with the accompanying drawing in which:

FIG. 1 shows a schematic circuit diagram of a polarity-sensitive oscillator in accordance with one embodiment of this invention; and, FIG. 2 is a typical current-voltage characteristic of a tunnel diode device particularly suitable for use in the practice of this invention.

One semiconductor device especially suited for use in the practice of this invention is a tunnel diode device. Tunnel diode devices are well-known in the art and are two terminal devices having a very narrow space charge region such that the current at low voltages is determined essentially by the quantum mechanical tunneling process. Many semiconductor devices of this type exhibit a strong region of negative resistance in the low forward voltage range of their current-voltage characteristics. For purposes of this invention the tunnel diode devices utilized should exhibit a negative resistance characteristic. Further details of such devices may be had by reference to the booklet entitled "Tunnel Diodes" published in November 1959, by Research Information Services, General Electric Company, Schenectady, New York.

In FIG. 1 there is shown an inductance 1 and a pair of back-to-back connected tunnel diode devices 2 and 3 connected in a series circuit loop having input terminals 4 and 5 respectively. The oscillator circuit includes means for developing a bias voltage from an applied input signal. Conveniently, this means may be a resistance 6 and by-pass capacitance 7 connected in parallel across the input terminals 4 and 5. Resistance 6 serves as a load on the negative resistances of tunnel diode devices 2 and 3 respectively, and should have a value approximately equal to the absolute magnitude of the negative resistances thereof. Capacitance 7 serves as a by-pass and may have any value which is large enough to assure that the reactance thereof is small at the operating frequencies as compared to the value of resistance 6. Since the tunnel diode devices are connected in back-to-back relationship, this developed bias voltage provides forward bias for one device and reverse bias for the other.

The oscillator circuit of FIG. 1 also includes a frequency determining circuit having two different resonant circuit branches with each branch being effectively connected across one of the tunnel diode devices at the particular resonant frequency of the circuit branch. To this end, a series combination of capacitances 8 and 9 are connected across the back-to-back connected tunnel diode devices 1 and 2. The junction 10 between tunnel diode devices 1 and 2 and the junction 11 between the series connected capacitances 8 and 9 are connected together as shown conveniently, for example, by conductor 12. The combination of capacitance 8 and inductance 1 provides a first resonant circuit branch having a resonant frequency $f_1$, for example, and the combination of capacitance 9 and inductance 1 provides the other branch having a resonant frequency $f_2$. The output of the oscillator circuit is present at the output terminals 13 and 14.

As shown in FIG. 2 by the typical current-voltage characteristic of a tunnel diode device suitable for use in the practice of this invention, the tunnel diode device exhibits a region of negative resistance, indicated generally at A, in the low forward voltage range of its current-voltage characteristic. Further, the characteristic in FIG. 2 illustrates that in the reverse voltage direction the tunnel diode device exhibits a very low positive resistance. For example, a suitably reverse biased tunnel diode device is essentially a short circuit.

The forward voltage range of the current-voltage characteristic of such tunnel diode devices at which the negative resistance region appears, varies depending upon the semiconductive material from which it is fabricated. For example, the range of the negative resistance region in a germanium device is from about 0.04 to 0.3 volts while for a gallium-arsenide device the range is about 0.12 to 0.5 volts.

When such tunnel diode devices are suitably biased in the low forward voltage range the negative resistance characteristic thereof may be utilized to provide oscillating and amplifying functions. As described above with respect to the characteristic of FIG. 2, however, when such a device is reversed biased, its resistance is extremely low and it appears essentially as a short circuit.

In the polarity sensitive oscillator circuit of this invention the presence of an input pulse of one polarity provides one tunnel diode device with a low forward bias establishing operation therefor in the negative resistance region and the other tunnel diode device with a reverse bias establishing operation therefor in a region of extremely low resistance. Thus, one tunnel diode device is biased for operation in its negative resistance region and produces oscillations at a frequency determined by the resonant impedance of the oscillatory circuit connected thereacross. The other tunnel diode device is essentially a short circuit and, therefore, is effectively out of the circuit.

More particularly, a positive input pulse on terminals 4 and 5, provides a forward bias for tunnel diode device 2 and a reverse bias for tunnel diode device 3. For example, the positive input pulse indicated generally at 15 develops across resistance 6 a voltage sufficient to provide an operating point for tunnel diode device 2 which is in the negative resistance region of its current-voltage characteristic. Since diode 3, however, is connected opposite to tunnel diode device 2 this voltage developed by the applied signal establishes an operating point in the reverse voltage direction and provides tunnel diode 3 with extremely low resistance.

For a positive input pulse, therefore, the circuit of FIG. 1 essentially includes only the single resonant circuit of inductance 1 and capacitance 8 connected across tunnel diode device 2. Since tunnel diode device 2 is biased for operation in the negative resistance region, oscillations are produced thereby at a frequency, for example, $f_1$ determined by the resonant impedance of the combination of inductance 1 and capacitance 8. Similarly, a negative input pulse on terminals 4 and 5 provides a forward bias for tunnel diode device 3 and a reverse bias for tunnel diode device 2 and oscillations are produced at the frequency $f_2$ determined by the resonant impedance of the combination of inductance 1 and capacitance 9.

This novel circuit, therefore, is extremely inexpensive and simplified and has the property of producing oscillations at one frequency in response to a positive input pulse and at a different frequency in response to a negative input pulse. Such oscillations continue for the duration of the input signal.

One oscillator circuit constructed in accordance with with this invention for producing oscillations at one frequency in response to an input signal of one polarity and oscillations at a different frequency in response to an input signal of opposite polarity utilized the following parameters which are given by way of example only:

| | |
|---|---|
| Inductance **1** | 0.1 microhenry. |
| Tunnel diode devices **2** and **3** | General Electric Company No. IN2939 or equivalent. |
| Resistor **6** | 75 ohm. |
| Capacitance **7** | 300 micromicrofarads. |
| Capacitances **8** and **9** | Variable: 10–30 micromicrofarads. |

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. A polarity-sensitive oscillator circuit comprising: a pair of semiconductor devices connected in back-to-back relationship, each device exhibiting a negative resistance region in one-polarity bias condition and a low positive resistance region in the corresponding opposite polarity bias condition; means connected in circuit with said back-to-back connected semiconductor devices for developing a voltage from an applied input signal, said voltage providing bias for one of said devices to establish said one-polarity bias condition therefor and bias for said other device to establish said corresponding opposite polarity bias condition; and a frequency determining circuit including two resonant circuit branches having different resonant frequencies in circuit with said back-to-back connected semiconductor devices so that oscillations determined by the resonant impedance of the circuit branch associated therewith are produced by the semiconductor device biased in said one-polarity bias condition wherein the negative resistance is present.

2. An oscillator circuit adapted to produce oscillations at a first frequency in response to an input signal of one-polarity and oscillations at a second frequency in response to an input signal of opposite polarity comprising: first and second tunnel diode devices connected in back-to-back relationship, each of said devices exhibiting a negative resistance region in the low forward voltage range of its current-voltage characteristic and a low positive resistance in the reverse voltage range thereof; means coupled to said tunnel diode devices for developing a bias voltage therefor from an applied input signal, said bias voltage establishing forward bias and operation in the negative resistance region for one of said tunnel diode devices and reverse bias and operation in a low positive resistance region for the other tunnel diode device; and a frequency determining circuit including two circuit branches having different resonant frequencies in circuit with said back-to-back connected tunnel diode devices to cause oscillations to be produced by the forwardly biased tunnel diode device the frequency of which oscillations is determined by the resonant impedance of the circuit branch associated therewith.

3. A polarity-sensitive oscillator circuit comprising: a pair of semiconductor devices connected in back-to-back relationship, each device exhibiting a negative resistance region in one-polarity bias condition and a low positive resistance region in the corresponding opposite polarity bias condition; means connected in circuit with said back-to-back connected semiconductor devices for developing a voltage from an applied input signal, said voltage providing bias for one of said devices to establish said one-polarity bias condition therefor and bias for said other device to establish said corresponding opposite polarity bias condition therefor; and a frequency determining circuit including two resonant circuit branches having different resonant frequencies, each circuit branch being effectively connected across one of said diode devices so that oscillations determined by the resonant impedance of the circuit branch associated therewith are produced by the semiconductor device biased in said one-polarity bias condition wherein the negative resistance is present.

4. An oscillator circuit adapted to produce oscillations at a first frequency in response to an input signal of one-polarity and oscillations at a second frequency in response to an input signal of opposite polarity comprising: first and second tunnel diode devices connected in back-to-back relationship, each of said devices exhibiting a negative resistance region in the low forward voltage range of its current-voltage characteristic and a low positive resistance in the reverse voltage range thereof; means coupled to said tunnel diode devices for developing a bias voltage therefor from an applied input signal, said bias voltage establishing forward bias and operation in the negative resistance region for one of said tunnel diode devices and reverse bias and operation in a low positive resistance region for the other tunnel diode device; and a frequency determining circuit including two circuit branches having different resonant frequencies with each circuit branch effectively connected across one of said tunnel diode devices to cause oscillations to be produced by the forwardly biased tunnel diode device.

5. A polarity-sensitive oscillator circuit having input and output means comprising: first and second tunnel diode devices connected in back-to-back relationship, each of said diode devices exhibiting a negative resistance region in the low forward voltage range of its current-voltage characteristic and a low positive resistance in the reverse voltage range thereof; resistance means connected across the input of said oscillator circuit for developing in response to an applied input signal of one-polarity a low forward bias for one tunnel diode device to establish operation in said negative resistance region and a corresponding reverse bias for the other tunnel diode device; and a frequency determining circuit including two different resonant circuit branches, each branch effectively connected across one of said tunnel diode devices so that oscillations determined by the resonant impedance of the circuit connected thereacross are produced by the forward biased tunnel diode device.

6. A polarity-sensitive oscillator circuit comprising: a pair of tunnel diode devices connected in back-to-back relationship, each of said devices exhibiting a negative resistance region in the forward bias direction and a low positive resistance region in the reverse bias direction; means connected in circuit with said back-to-back connected tunnel diode devices for developing a voltage from an applied input signal, said voltage providing forward bias for one of said tunnel diode devices for operation in said negative resistance region thereof and reverse bias for the other tunnel diode device for operation in its low positive resistance region; and a frequency determining circuit in circuit with said back-to-back connected tunnel diode devices, said network including an inductance and first capacitance combination effectively connected across one of said devices at the resonant frequency of said combination and said inductance and a second capacitance combination effectively connected across the other device at the resonant frequency of that combination so that oscillations are produced which are determined in frequency by the resonant impedance of the inductance-capacitance combination connected across the tunnel diode device biased in the forward direction by said applied input signal.

7. An oscillator circuit adapted to generate oscillations at a first frequency in response to an input signal of one-polarity and oscillations at a second frequency in response to an input signal of opposite polarity comprising: first and second tunnel diode devices connected in back-to-back relationship, each of said tunnel diode devices exhibiting a negative resistance region in the low forward voltage range of its current-voltage characteristic and a low positive resistance region in the reverse voltage range thereof; means including a resistance for developing a voltage from an applied input signal, said voltage providing forward bias for one of said tunnel diode devices for operation in its negative resistance region and reverse bias for the other tunnel diode device for operation at a low positive resistance region; an inductance connected in series with said input between said resistance and said back-to-back connected tunnel diode devices; a first capacitance connected across one of said tunnel diode devices to provide with said inductance a first resonant circuit; and a second capacitance connected across said other tunnel diode device to provide with said inductance a second resonant circuit.

No references cited.